United States Patent
Chu et al.

(10) Patent No.: US 10,269,614 B2
(45) Date of Patent: Apr. 23, 2019

(54) SUSCEPTOR DESIGN TO REDUCE EDGE THERMAL PEAK

(71) Applicant: Applied Materials, Inc., Santa Clara, CA (US)

(72) Inventors: Schubert S. Chu, San Francisco, CA (US); Kartik Shah, Sunnyvale, CA (US); Anhthu Ngo, San Jose, CA (US); Karthik Ramanathan, Bangalore (IN); Nitin Pathak, Bangalore (IN); Nyi O. Myo, San Jose, CA (US); Paul Brillhart, Pleasanton, CA (US); Richard O. Collins, Santa Clara, CA (US); Kevin Joseph Bautista, San Jose, CA (US); Edric Tong, Sunnyvale, CA (US); Zhepeng Cong, Vancouver, WA (US); Anzhong Chang, San Jose, CA (US); Kin Pong Lo, Fremont, CA (US); Manish Hemkar, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 576 days.

(21) Appl. No.: 14/885,016

(22) Filed: Oct. 16, 2015

(65) Prior Publication Data

US 2016/0133504 A1    May 12, 2016

Related U.S. Application Data

(60) Provisional application No. 62/084,821, filed on Nov. 26, 2014, provisional application No. 62/078,782, filed on Nov. 12, 2014.

(51) Int. Cl.
*H01L 21/687* (2006.01)
*H01L 21/67* (2006.01)
*C23C 16/458* (2006.01)

(52) U.S. Cl.
CPC .... *H01L 21/68735* (2013.01); *C23C 16/4583* (2013.01); *H01L 21/67115* (2013.01)

(58) Field of Classification Search
CPC .................................................. H01L 21/68735
See application file for complete search history.

(56) References Cited

U.S. PATENT DOCUMENTS

| 5,855,687 A | 1/1999 | DuBois et al. |
| 6,395,363 B1 | 5/2002 | Ballance et al. |
(Continued)

FOREIGN PATENT DOCUMENTS

| WO | 2013155073 A1 | 10/2013 |
| WO | WO2014062002 | * 4/2014 |

OTHER PUBLICATIONS

International Search Report and Written Opinion for International Application No. PCT/US2015/056994 dated Jan. 20, 2016.

*Primary Examiner* — Joseph A Miller, Jr.
(74) *Attorney, Agent, or Firm* — Patterson + Sheridan LLP

(57) ABSTRACT

Implementations of the present disclosure generally relate to a susceptor for thermal processing of semiconductor substrates. In one implementation, the susceptor includes a first rim surrounding and coupled to an inner region, and a second rim disposed between the inner rim and the first rim. The second rim includes an angled support surface having a plurality of cut-outs formed therein, and the angled support surface is inclined with respect to a top surface of the inner region.

15 Claims, 11 Drawing Sheets

(56) References Cited

U.S. PATENT DOCUMENTS

| | | | |
|---|---|---|---|
| 6,676,759 B1 | 1/2004 | Takagi | |
| 8,075,728 B2 | 12/2011 | Balakrishna et al. | |
| 2005/0000449 A1 | 1/2005 | Ishibashi et al. | |
| 2005/0022746 A1* | 2/2005 | Lampe | C23C 16/4581 118/728 |
| 2006/0180086 A1 | 8/2006 | Kanaya et al. | |
| 2006/0291835 A1* | 12/2006 | Nozaki | H01L 21/67115 392/416 |
| 2007/0144442 A1* | 6/2007 | Migita | C23C 16/4586 118/728 |
| 2008/0314319 A1* | 12/2008 | Hamano | C23C 16/4583 118/728 |
| 2009/0175605 A1* | 7/2009 | Kobayashi | H01L 21/67115 392/416 |
| 2009/0314210 A1 | 12/2009 | Ishibashi et al. | |
| 2011/0209660 A1* | 9/2011 | Myo | C23C 16/4586 117/88 |
| 2013/0109192 A1 | 5/2013 | Hawkins et al. | |
| 2015/0275395 A1* | 10/2015 | Kang | C30B 25/12 118/728 |

* cited by examiner

SUSCEPTOR DESIGN TO REDUCE EDGE THERMAL PEAK

CROSS-REFERENCE TO RELATED APPLICATIONS

This application claims benefit of U.S. provisional patent application Ser. Nos. 62/078,782, filed Nov. 12, 2014 and 62/084,821, filed Nov. 26, 2014, which are herein incorporated by reference.

BACKGROUND

Field

Implementations of the present disclosure generally relate to a susceptor for use in a thermal process chamber.

Description of the Related Art

Semiconductor substrates are processed for a wide variety of applications, including the fabrication of integrated devices and microdevices. During processing, the substrate is positioned on a susceptor within a process chamber. Susceptors often have platter or dish-shaped upper surfaces that are used to support the substrate from below around the edges of the substrate while leaving a small gap between the remaining lower surface of the substrate and the upper surface of the susceptor. The susceptor is supported by a support shaft, which is rotatable about a central axis. Precise control over a heating source, such as a plurality of heating lamps disposed below the susceptor, allows a susceptor to be heated within very strict tolerances. The heated susceptor can then transfer heat to the substrate, primarily by radiation emitted by the susceptor.

Despite the precise control of heating the susceptor, it has been observed that the susceptor may cause temperature non-uniformity across the substrate due to non-uniform heat convection or conduction heat losses from regions of the substrate in contact with the susceptor and substrate regions not in contact with the susceptor. Temperature non-uniformities persist across the upper surface of the substrate often reducing the quality of the layers deposited on the substrate. Undesirable temperature profiles have been observed near the edges of the substrate as well as over areas closer to the center of the substrate. Therefore, a need exists for an improved susceptor for supporting and heating substrates in semiconductor processing.

SUMMARY

Implementations of the present disclosure generally relate to a susceptor for thermal processing of semiconductor substrates. In one implementation, the susceptor includes a first rim surrounding and coupled to an inner region, and a second rim disposed between the inner region and the first rim, wherein the second rim comprises an angled support surface having a plurality of cut-outs formed therein, and the angled support surface is inclined with respect to a top surface of the inner region.

In another implementation, the susceptor includes a first rim surrounding and coupled to an inner region, and a second rim disposed between the inner region and the first rim. The second rim comprises a support surface having a plurality of tabs formed therein, and the support surface is inclined with respect to a top surface of the inner region. The second rim also comprises a plurality of venting channels formed in the top surface of the inner region, the venting channels extending radially from an outer edge of the inner region towards an inner edge of the inner region.

In yet another implementation, the susceptor includes a first rim surrounding and coupled to an inner region, and a second rim disposed between the inner region and the first rim. The second rim comprises a substrate support surface having a plurality of tabs formed therein, wherein the substrate support surface is inclined with respect to a top surface of the inner region. The second rim also comprises a recessed portion disposed between the substrate support surface and an outer edge of the inner region, wherein a top surface of the recessed portion is at an elevation lower than the top surface of the inner region.

BRIEF DESCRIPTION OF THE DRAWINGS

So that the manner in which the above recited features of the present disclosure can be understood in detail, a more particular description of the disclosure, briefly summarized above, may be had by reference to Implementations, some of which are illustrated in the appended drawings. It is to be noted, however, that the appended drawings illustrate only typical Implementations of this disclosure and are therefore not to be considered limiting of its scope, for the disclosure may admit to other equally effective Implementations.

Figure 1:
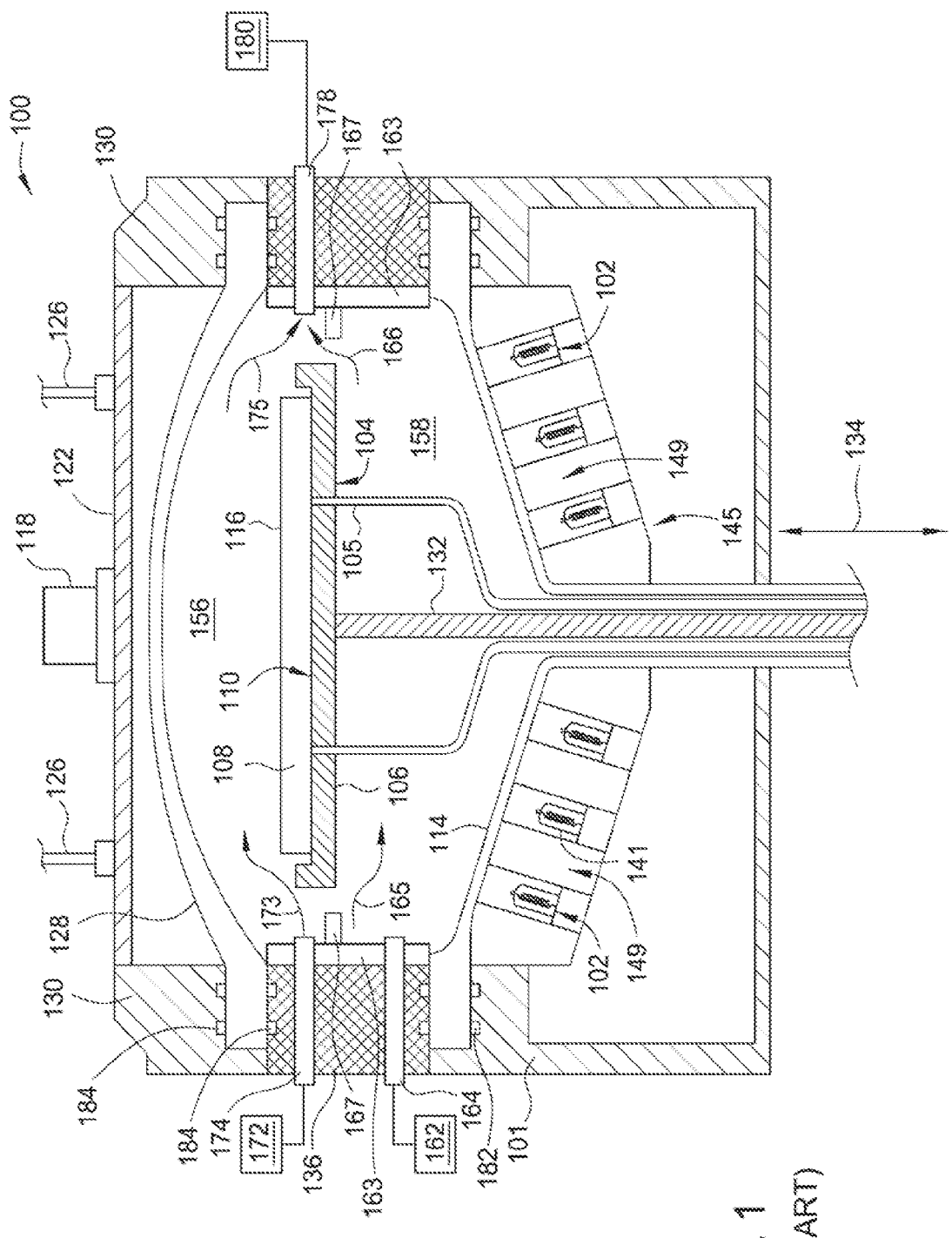
FIG. 1 illustrates a schematic sectional view of a process chamber with components in position for processing that may be benefit from Implementations of the present disclosure.

To facilitate understanding, identical reference numerals have been used, where possible, to designate identical elements that are common to the figures. It is contemplated that elements disclosed in one implementation may be beneficially utilized in other Implementations without specific recitation.

DETAILED DESCRIPTION

Implementations of the present disclosure generally relate to a susceptor for thermal processing of semiconductor substrates. Implementations disclosed can improve thermal uniformity across the surface of a substrate during processing by reducing a contacting surface area between the susceptor and the substrate. Reducing the contacting surface area between the susceptor and the substrate reduces the amount of heat that is transferred from the susceptor to the substrate by conduction during processing. In some Implementations, the angled surface of the susceptor that is in contact with the substrate may have a plurality of cut-outs or tabs to provide azimuthal heat uniformity around the circumference of the susceptor. In some Implementations, the susceptor may further provide a plurality of radial channels around the circumference of the susceptor to help venting of the heat or gas flow during processing. Details of the Implementations of the susceptor are described below.

Exemplary Chamber Hardware

FIG. 1 illustrates a schematic sectional view of a conventional process chamber 100 with components in position for processing that may be benefit from Implementations of the present disclosure. It is contemplated that while a process chamber for epitaxial process is shown and described, the concept of the present disclosure is also applicable to other process chamber that is capable of providing a controlled thermal cycle that heats the substrate for processes such as, for example, thermal annealing, thermal cleaning, thermal chemical vapor deposition, thermal oxidation and thermal nitridation, regardless of whether the heating elements are provided at the top, bottom, or both of the process chamber.

The process chamber 100 and the associated hardware may be formed from one or more process-compatible materials, such as stainless steel, quartz (e.g., fused silica glass), SiC, CVD-coated SiC over graphite (30-200 microns), and combinations and alloys thereof, for example. The process chamber 100 may be used to process one or more substrates, including the deposition of a material on an upper surface of a substrate 108. The process chamber 100 includes an array of radiant heating lamps 102 for heating, among other components, a back side 104 of a susceptor 106 disposed within the process chamber 100. The susceptor 106 may be located within the process chamber 100 between an upper dome 128 and a lower dome 114. In some Implementations, an array of radiant heating lamps may be disposed over the upper dome 128 in addition to the array shown below the lower dome 114. The susceptor 106 may be a disk-like susceptor, or may be a ring-like susceptor support with a central opening, which supports the substrate from the edge of the substrate to facilitate exposure of the substrate to the thermal radiation of the lamps 102. According to one implementation, the susceptor 106 is supported by a central shaft 132, which may directly or indirectly support the susceptor 106 as shown in FIG. 1.

The upper dome 128, the lower dome 114, and a base ring 136 that is disposed between the upper dome 128 and lower dome 114 define an internal region of the process chamber 100. The central portions of the upper dome 128 and of the lower dome 114 may be formed from an optically transparent material, such as quartz. The internal region of the process chamber 100 is generally divided into a process region 156 and a purge region 158. The substrate 108 (not to scale) can be brought into the process chamber 100 through a loading port (not shown, obscured by the susceptor 106) and positioned on the susceptor 106.

According to one implementation, the process chamber 100 also comprises a lamphead 145, which supports the array of lamps 102 and cools the lamps 102 during and/or after processing. Each lamp 102 is coupled to an electricity distribution board (not shown), which supplies electricity to each lamp 102.

A preheat ring 167 may be optionally disposed around the susceptor 106 and surrounded by a liner assembly 163. The preheat ring 167 prevents or reduces leakage of heat and or light noise from the lamps 102 to the device side 116 of the substrate 108 while providing a pre-heat zone for the process gases. The preheat ring 167 may be made from chemical vapor deposited (CVD) SiC, sintered graphite coated with SiC, grown SiC, opaque quartz, coated quartz, or any similar, suitable material that is resistant to chemical breakdown by process and purging gases.

The liner assembly 163 is sized to be nested within or surrounded by an inner circumference of the base ring 136. The liner assembly 163 shields the metallic walls of the process chamber 100 from the process gases used in processing. The metallic walls may react with the process gases and be damaged or introduce contamination into the process chamber 100. While the liner assembly 163 is shown as a single body, in Implementations of the present disclosure, the liner assembly 163 may comprise one or more liners and other components.

In one implementation, the process chamber 100 may also include one or more optical pyrometer(s) 118, which measure temperatures within the process chamber 100 and on the surface of substrate 108. A controller (not shown) controls electricity distribution from the electricity distribution board to the lamps 102 and flows of cooling fluids within the process chamber 100. The controller controls temperatures within the process chamber by varying the electrical voltage from the electrical distribution board to the lamps 102 and by varying the flows of cooling fluids.

A reflector 122 may be optionally placed outside the upper dome 128 to reflect infrared light radiating from the substrate 108 and upper dome 128 back into the process chamber 100. The reflector 122 may be secured to the upper dome 128 using a clamp ring 130. The reflector 122 may have one or more connection ports 126 connected to a cooling fluid source (not shown). The connection ports 126 may connect to one or more passages (not shown) within the reflector to allow cooling fluid (e.g., water) to circulate within the reflector 122.

In one implementation, the process chamber 100 comprises a process gas inlet 174 connected to a process gas source 172. The process gas inlet 174 may be configured to direct process gas generally across the surface of the substrate 108. The process chamber may also comprise a process gas outlet 178 located on the side of the process chamber 100 opposite the process gas inlet 174. The process gas outlet 178 is coupled to a vacuum pump 180.

In one implementation, the process chamber 100 comprises a purge gas inlet 164 formed in the sidewall of the base ring 136. A purge gas source 162 supplies purge gas to the purge gas inlet 164. If the process chamber 100 comprises the preheat ring 167, the preheat ring 167 is disposed between the process gas inlet 174 and the purge gas inlet 164. The process gas inlet 174, purge gas inlet 164, and process gas outlet 178 are shown for illustrative purposes, and the position, size, number of gas inlets and outlets, etc. may be adjusted to facilitate a uniform deposition of material on the substrate 108.

The susceptor 106 is shown in a position to allow processing of a substrate in the process chamber. The central shaft 132, susceptor 106, and arms 134 may be lowered by an actuator (not shown). A plurality of lift pins 105 pass through the susceptor 106. Lowering the susceptor to a loading position below the processing position allows lift pins 105 to contact the lower dome 114, pass through holes in the susceptor 106 and the central shaft 132, and raise the substrate 108 from the susceptor 106. A robot (not shown) then enters the process chamber 100 to engage and remove the substrate 108 though the loading port (not shown). The robot or another robot enters the process chamber through the loading port and places an unprocessed substrate on the susceptor 106. The susceptor 106 then is raised to the processing position by the actuator to place the unprocessed substrate in position for processing.

In one implementation, processing of a substrate 108 in the process chamber 100 comprises inserting the substrate through the loading port, placing the substrate 108 on the susceptor 106, raising the susceptor 106 and substrate 108 to the processing position, heating the substrate 108 by the lamps 102, flowing process gas 173 across the substrate 108, and rotating the substrate 108. In some cases, the substrate may also be raised or lowered during processing.

In some aspects of the present disclosure, epitaxial processing in process chamber 100 comprises controlling the pressure within the process chamber 100 to be lower than atmospheric pressure. In some Implementations, pressure within the process chamber 100 is reduced to be between approximately 10 torr and 80 torr. In some Implementations, pressure within the process chamber 100 is reduced to be between approximately 80 torr and 300 torr. The vacuum pump 180 is activated to reduce the pressure of the process chamber 100 before and/or during processing.

The process gas 173 is introduced into the process chamber 100 from one or more process gas inlets 174, and exits the process chamber 100 through one or more process gas outlets 178. The process gas 173 deposits one or more materials on the substrate 108 through thermal decomposition, for example, or other reactions. After depositing materials on the substrate 108, effluent (i.e., waste gases) 175 are formed from the reactions. The effluent 175 exits the process chamber 100 through the process gas outlets 178.

When processing of a substrate 108 is complete, the process chamber is purged of process gas 173 and effluent 175 by introduction of purge gas 165 (e.g., hydrogen or nitrogen) through the purge gas inlets 164. Purge gas 165 may be introduced through the process gas inlets 174 instead of, or in addition to, the purge gas inlets 164. The purge gas 175 exits the process chamber through the process gas outlets 178.

Exemplary Susceptor

Figure 2:
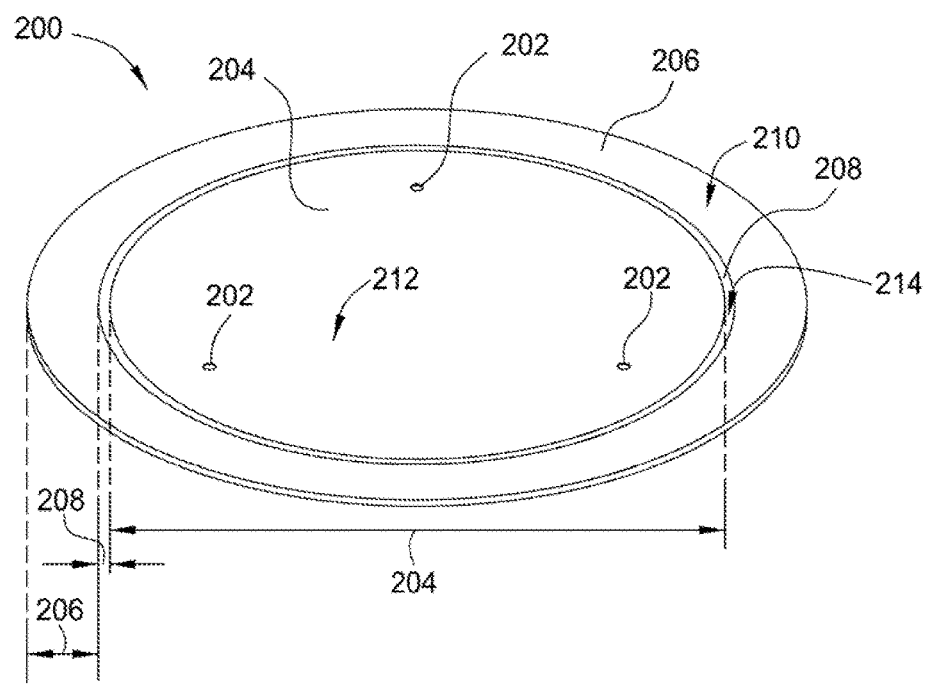
FIG. 2 illustrates a perspective view of an exemplary susceptor that is used in the process chamber according to Implementations of the disclosure.

FIG. 2 illustrates a perspective view of an exemplary susceptor 200 that may be used in place of the susceptor 106 (FIG. 1) according to Implementations of the disclosure. The susceptor 200 is a substantially annular plate divided into an inner region 204, a first rim 206 surrounding and coupled to the inner region 204, and a second rim 208 disposed between the inner region 204 and the first rim 206. The inner region 204 may be slightly lower than a top surface 210 of the first rim 206 to form a recessed pocket 212 sized to receive the majority of the substrate. Susceptors, such as susceptor 200, are generally sized so that the substrate to be processed on the susceptor fits just inside the first rim, such as the first rim 206 of the susceptor 200. The recessed pocket 212 thus prevents the substrate from slipping out during processing. In one implementation, the top surface of the recessed pocket 212 may be about 0.5 mm to about 2 mm below the top surface 210 of the first rim 206. The height of the recessed pocket 212 is variable and is determined by the thickness of the substrate supported by the susceptor 200.

The inner region 204 is provided with a number of through-holes 202, for example 3 through-holes, corresponding to the placement of the lift pins (FIG. 1). The through-holes 202 allow the lift pins 105 to pass through the susceptor 200 to raise or lower the substrate from the susceptor 200. The through-holes 202 may be arranged at 120 degree intervals in a circumferential direction.

Figure 5A:
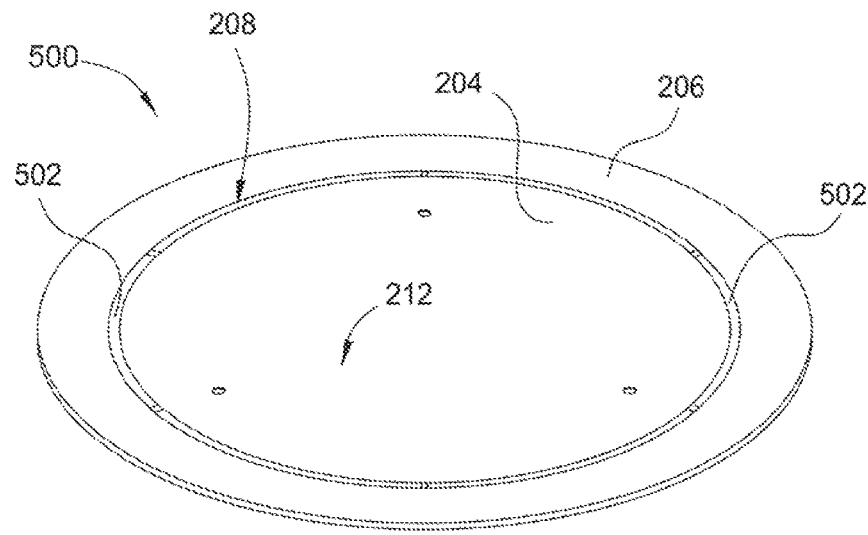
FIG. 5A illustrates a perspective view of a susceptor showing the cut-outs according to Implementations of the present disclosure.

The second rim 208 may have an angled surface 214, which serves as part of a supporting surface for a substrate. The angled surface 214 can reduce a contacting surface area between a substrate (not shown) and the susceptor 200 when the substrate is supported by the susceptor 200. The angled surface 214 may be inclined with respect to a horizontal surface (e.g., top surface) of the inner region 204. The angled surface 214 may be angled between about 2 degrees to about 20 degrees, such as about 6 degrees to about 15 degrees. Varying the slope or dimensions of the angled surface 214 can control the size of a gap between the bottom of the substrate and the upper surface of a recessed portion 218 (FIG. 3A), or the height of the bottom of the substrate relative to the recessed pocket 212. The angle and location of the angled surface 214 can also be used to control a radial location corresponding to where the substrate can contact the angled surface 214 during processing. In one implementation as shown, the angled surface 214 is a continuous surface around the circumference of the second rim 208. Alternatively, the angled surface 214 may have two or more cut-outs, for example six (6) cut-outs, as shown in the implementation of FIG. 5A.

Figure 3A:
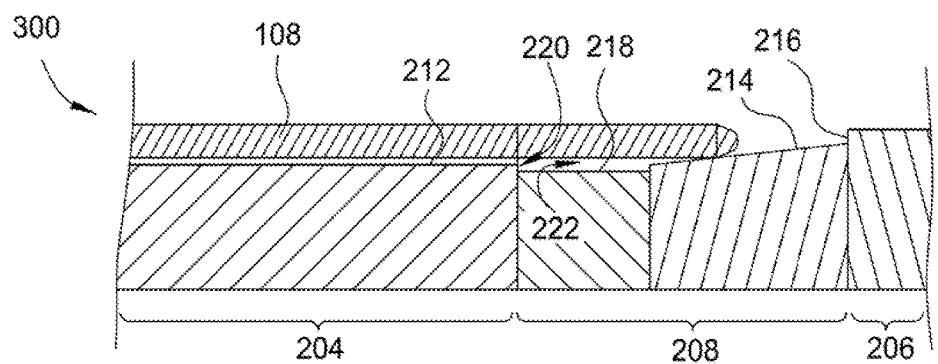
FIG. 3A illustrates a partial cross-sectional view of the susceptor according to Implementations of the disclosure.

FIG. 3A illustrates a partial cross-sectional view of a susceptor 300 that may be used in place of the susceptor 106 (FIG. 1) according to Implementations of the disclosure. The cross-sectional view shows the angled surface 214 extending radially inward from an inner edge 216 of the first rim 206 toward the inner region 204. In some Implementations, a recessed portion 218 may be further provided between the angled surface 214 and an outer edge 220 of the inner region 204. A top surface of the recessed portion 218 couples the angled surface 214 to the top surface of the recessed pocket 212. The recessed portion 218 may be configured at an elevation slightly lower than the recessed pocket 212. For example, the top surface of the recessed portion 218 may be formed to a level of approximately 0.1 mm to about 0.2 mm below the top surface of the inner region 204. In some Implementations, the gap 222 between the bottom of the substrate 108 and the top surface of the recessed portion 218 may be between about 0.1 mm and about 1 mm, for example about 0.3 mm. For a 300 mm substrate, the diameter of the inner region 204 may be about 290 mm. The outer edge 220 of the inner region 204 may be disposed at about 142 mm to about 150 mm, for example about 145 mm, measuring from the central axis of the inner region 204. The recessed portion 218 abutting the outer edge 220 may be about 1.5 mm to about 4.5 mm in diameter, for example about 3 mm.

The angled surface 214 can reduce a contacting surface area between a substrate 108 and the susceptor 300 when the substrate 108 is supported by the susceptor 300. In some Implementations, the substrate 108 may only contact the angled surface 214 during processing without contacting the inner region 204 or any other surface. By using a relatively steep angle, such as between about 6 to about 15 degrees, for example 9 degrees, a smaller surface area of the substrate edge contacts the susceptor 300 during processing, which reduces the amount of conductive heat that can be transferred from the susceptor 300 to the substrate 108. The angle and location of the angled surface 214 could be modified to achieve different thermal profiles during processing.

Figure 3B:
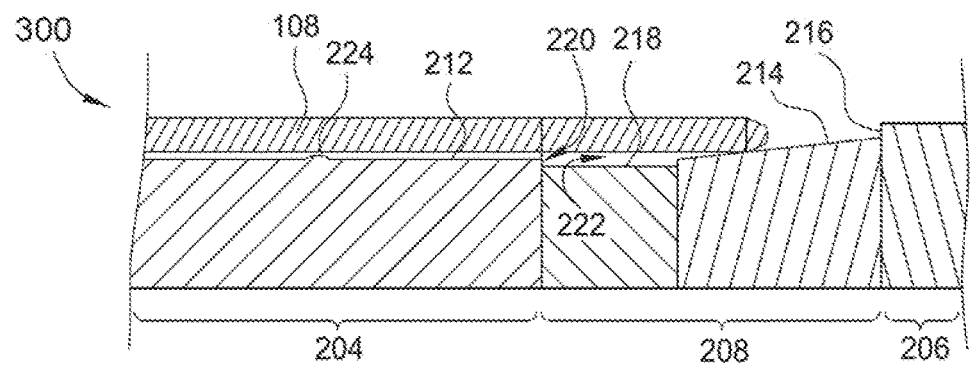
FIG. 3B illustrates a partial cross-sectional view of the susceptor having one or more bumps extending from the top surface of the inner rim.

In some Implementations, the susceptor 300 may have one or more bumps, such as bumps 224 shown in FIG. 3B, extending from the top surface of the inner region 204 to prevent a sagging substrate from contacting the inner region 204. The bumps or projections may be any suitable shape such as rectangular, rhombus, square, hemispherical, hexagonal, triangular protrusions or mixtures of differently shaped protrusions. The bumps 224 may be formed of the same material as the susceptor, or a different material, and may be made from silicon carbide, or graphite coated with silicon carbide or glassy carbon. When substrates are supported around the edges, such as when a susceptor is used during processing, the center of the substrate may sag below the edges of the substrate. The inner rim of the susceptors, such as the inner region 204, may be slightly concave (e.g., forming the recessed pocket 212) to prevent portions of an underside of a sagging substrate from contacting the susceptor during processing. On the other hand, to create the highly uniform process conditions in a thermal process such as epitaxy, the distance between the upper surface of the inner region 204 and the lower surface of the substrate is kept quite low, such as less than about 0.25 mm, for example about 0.15 mm. If the substrate contacts the inner region 204, heat is transferred from the inner region 204 to the substrate by conduction and thermal uniformity may be negatively affected. The bumps 224 can be used to support a sagging substrate, preventing contact between the inner region 204 and the substrate. The bumps 224 provide a contact surface area between the sagging substrate and the susceptor that is smaller than the surface area of the substrate that would contact the inner region 204 absent the bumps 224. The bumps 224 may be evenly distributed around the center of the inner region 204 or at regions close to the edge of the inner region 204. In some Implementations, to ensure adequate support of a sagging substrate there could always be at least one bump 224 on a side of the inner region 204.

In some Implementations, the bumps 224 may be disposed at a radial distance of about 20 mm to about 145 mm, such as about 50 mm to about 143 mm, for example about 140 mm, measuring from the center axis of the inner region 204. The bumps 224 may be about 0.4 mm to about 0.65 mm in diameter, for example about 0.56 mm in diameter. The bumps 224 may have a height of about 0.05 mm to about 0.12 mm, for example about 0.1 mm.

Figure 3C:
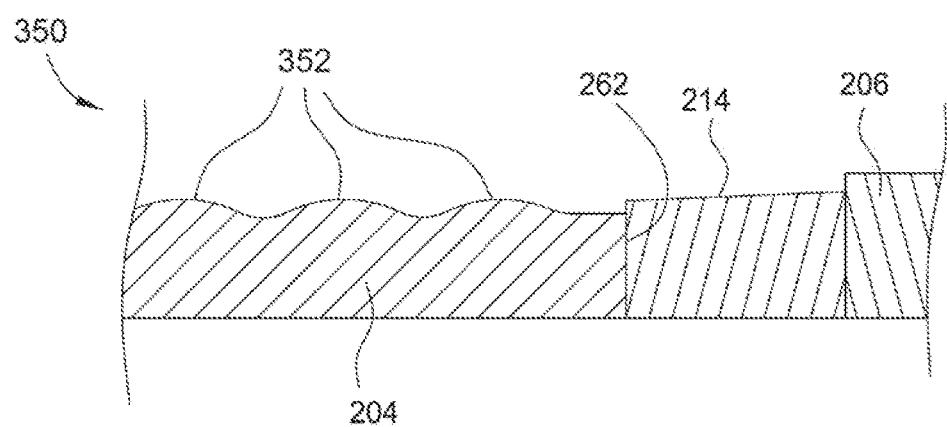
FIG. 3C illustrates a partial cross-sectional view of the susceptor having a wavy design according to implementations of the disclosure.

In some Implementations, the susceptor may be a wavy design including concentric annular ridges 352 surrounding the center of the inner region 204, as the susceptor 350 shown in FIG. 3C. Each annular ridge 352 may have a different diameter. In some Implementations, the susceptor may not provide the recessed portion 218 as shown in FIGS. 3A and 3B. In such a case, at least some of the annular ridges 352 may be located proximate an inner edge 262 of the angled surface 214. In some Implementations, the one or both of the annular ridges 352 and their respective upper surfaces are elevated structures relative to the top surface of the inner region 204. The ridges 352 may also improve thermal uniformity when processing a substrate by increasing radiative surface area of the upper surface of the susceptor 160. The annular ridges 352 may be made of the same material or a different material, which may be any of the same materials from which the susceptor is made. In some Implementations, some of the annular ridges 352 may be located within about 1 mm of the inner edge 262, for example within about 0.5 mm of the inner edge 262. The annular ridges 352 can reduce a contacting surface area between a substrate and the susceptor 350 when the substrate is supported by the susceptor 350. It is contemplated that Implementations of FIG. 3C may be combined with any other Implementations disclosed in the present disclosure.

Figure 4A:
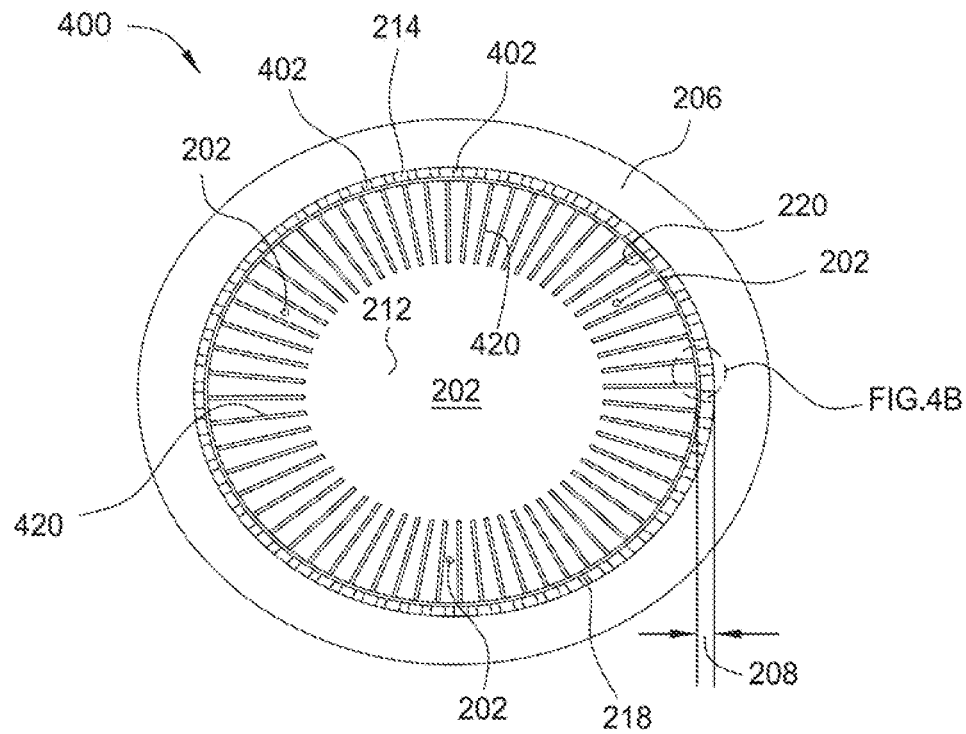
FIG. 4A illustrates a top sectional view of an exemplary susceptor that is used in the process chamber according to Implementations of the disclosure.
Figure 4B:
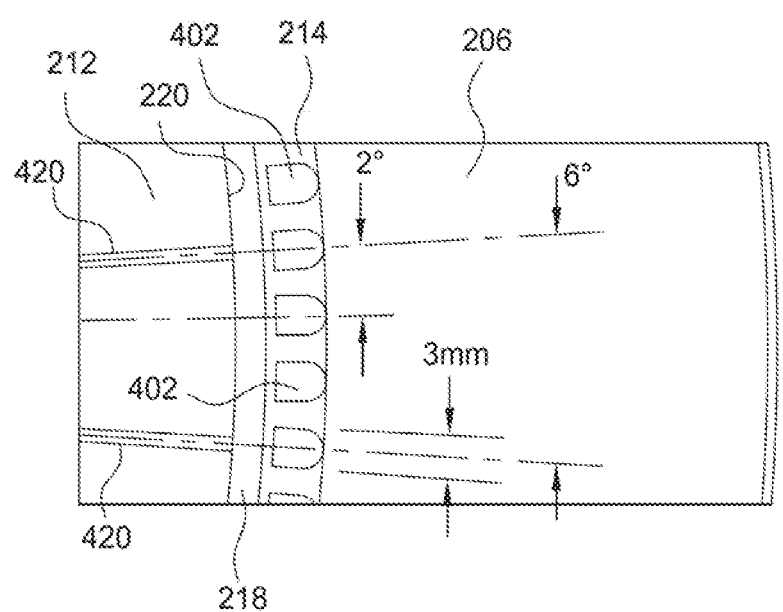
FIG. 4B illustrates an enlarged, partial top sectional view of the susceptor shown in FIG. 4A.

FIG. 4A illustrates a top sectional view of a susceptor 400 that may be used in place of the susceptor 106 (FIG. 1) according to Implementations of the disclosure. FIG. 4B illustrates an enlarged, partial top sectional view of the susceptor 400 shown in FIG. 4A. Implementations of FIGS. 4A and 4B are based on the Implementations of FIGS. 2 and 3A-3B. In various Implementations, the susceptor 400 further includes a plurality of cut-outs 402 in the second rim 208. The cut-outs 402 may be disposed in the angled surface 214 around the circumference of the susceptor 400. These cut-outs 402 improve thermal uniformity at the edges of the substrate because there are more gaps where the substrate is not contacting the susceptor 400. In other words, these cut-outs 402 provide a reduced or minimum contact surface between the susceptor and the substrate, which helps prevent localized hotspots from forming along the edges of the substrate since the contacting surface area between the susceptor and the substrate is greatly reduced. The cut-outs 402 may be made by carving or sculpting a recess from an unpatterned susceptor surface using any suitable technique.

In some Implementations, there may be about 6 cut-outs to about 360 cut-outs, such as about 12 cut-outs to about 180 cut-outs arranged around the circumference of the susceptor 400. More or less cut-outs 402 are contemplated. More cut-outs may provide higher thermal uniformity during processing by reducing the size of the individual surface areas on the susceptor 400 transferring heat to the substrate by conduction. The cut-outs 402 may be separated from one another at regular intervals in a circumferential direction. If 180 cut-outs were adapted, for example, each cut-out 402 may be separated azimuthally from two adjacent cut-outs by a 2 degree interval. Depending upon the size of the susceptor and/or the numbers of the cut-outs, the cut-outs may have a width of about 2 mm to about 10 mm, for example about 3 mm to about 8 mm. The cut-outs 402 may have any suitable shape such as arch-shaped, rectangular-shaped, square-shaped, round-shaped, V-shaped, U-shaped, or C-shaped cut-outs and their variations, or elongated shape of the above, or a combination thereof. FIGS. 4A and 4B illustrate one implementation where arch-shaped cut-outs are adapted.

In some Implementations, the susceptor 400 may optionally provide a plurality of venting channels 420 extending at a radial distance from the outer edge 220 of the inner region 204 towards the center of the inner region 204. The venting channels 420 are configured to help gas flow or exhaust gases trapped in the recessed pocket 212 to the recessed portion 218, and then into the internal region of the process chamber. Without venting channels 420, gases may become trapped, for example, when the substrate is initially positioned on the susceptor 400, during processing, or the like. If the gases remained trapped, for example, during a rapid pressure decrease in chamber pressure, the trapped gases may expand against the reduced chamber pressure causing the substrate to jump, shift, or otherwise move from its location on the susceptor.

The venting channels 420 may be extended inwardly at a radial distance of about 30 mm to about 80 mm from the outer edge 220 of the inner region 204. The venting channels 420 may be arranged at regular intervals around the circumference of the susceptor 400. The venting channels 420 may be formed as vertical trenches or grooves cut into the surface of the susceptor 400 at the inner region 204. In some Implementations, the bottom surface of the venting channels 420 may be at the same elevation as the bottom surface of the cut-outs 402. In some Implementations, the venting channels 420 may be spaced apart from one another azimuthally by an angle of about 4 degrees to about 8 degrees, for example about 6 degrees. The venting channels 420 may be cut to any suitable depth and/or length, and the number and/or spacing between venting channels 420 may be selected to enact rapid exhaust of gases from the recessed pocket 212. For example, the venting channels 420 may extend completely through the inner region 204 of the susceptor 400.

Figure 4C:
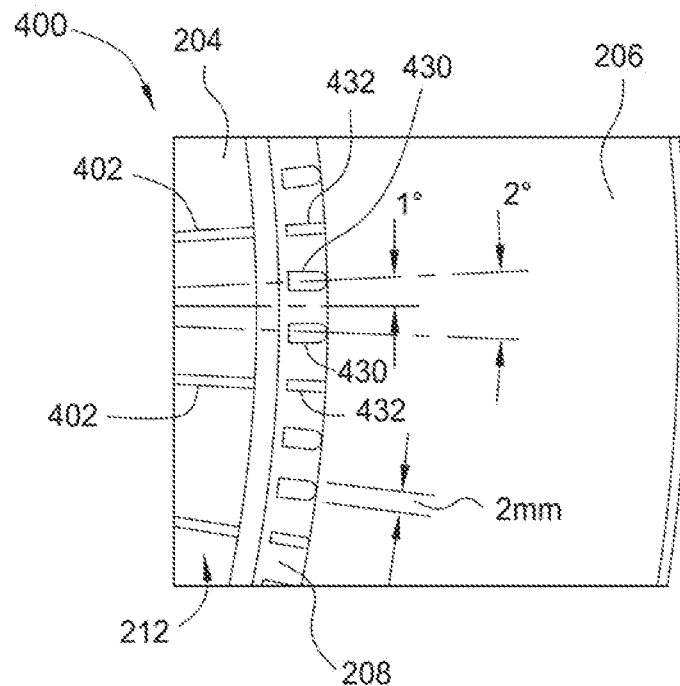
FIG. 4C illustrates an exemplary susceptor according to one implementation of the present disclosure.

FIG. 4C illustrates the susceptor 400 according to other Implementations of the present disclosure. In one implementation, two or more different shapes of cut-outs as discussed above are formed in the angled surface 214. In some aspects of this implementation, a first group of cut-outs having a first shape and a second group of cut-outs having a second shape that is different from the first shape may be alternatingly arranged along the circumference of the susceptor 106. Each group may contain two or more cut-outs of the same shape. In one example as shown in FIG. 4C, the cut-outs include a first group of arch-shaped cut-outs 430 and a second group of rectangular-shaped cut-outs 432 alternatingly arranged around the circumference of the susceptor 106. In this example, two arch-shaped cut-outs 430 are sandwiched between rectangular-shaped cut-outs 432, wherein the rectangular-shaped cut-outs 432 are generally in line with the venting channels 420 (i.e., corresponding to the radial location of the venting channels 420 along the circumference of the susceptor). In various Implementations, the arch-shaped cut-outs may have a width of about 2 mm, and two arch-shaped cut-outs may be separated azimuthally from each other by a 2 degree interval.

Figure 4D:
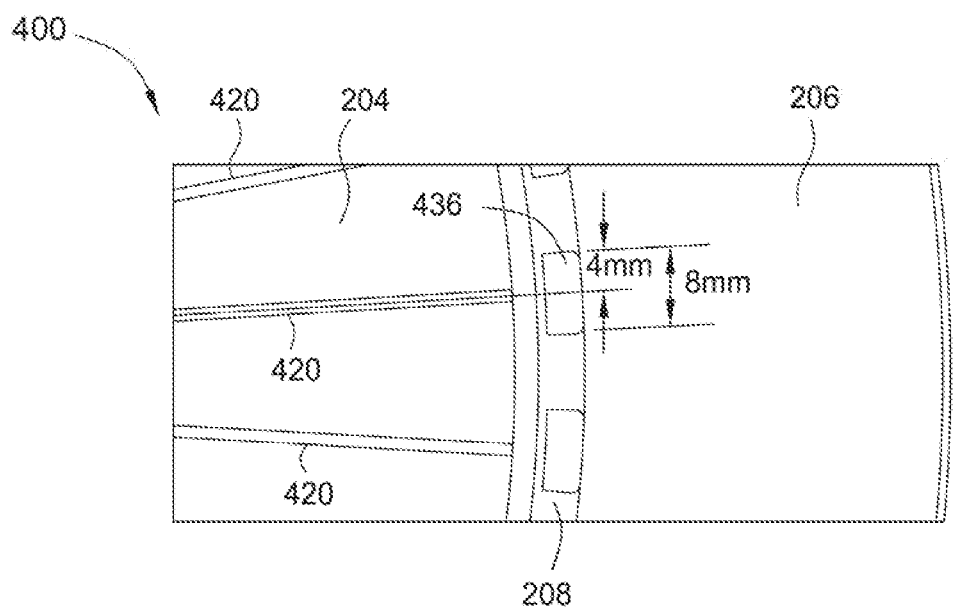
FIG. 4D illustrates an exemplary susceptor according to another implementation of the present disclosure.

FIG. 4D illustrates the susceptor 400 according to another implementation of the present disclosure. In this implementation, the cut-outs 436 are all rectangular-shaped cut-outs arranged around the circumference of the susceptor 400 at regular intervals. Each of the cut-outs 436 may have a width of about 8 mm. In some aspects, the cut-outs 436 are in line with the venting channels 420 (i.e., corresponding to the radial location of the venting channels 420 along the circumference of the susceptor).

Figure 5B:
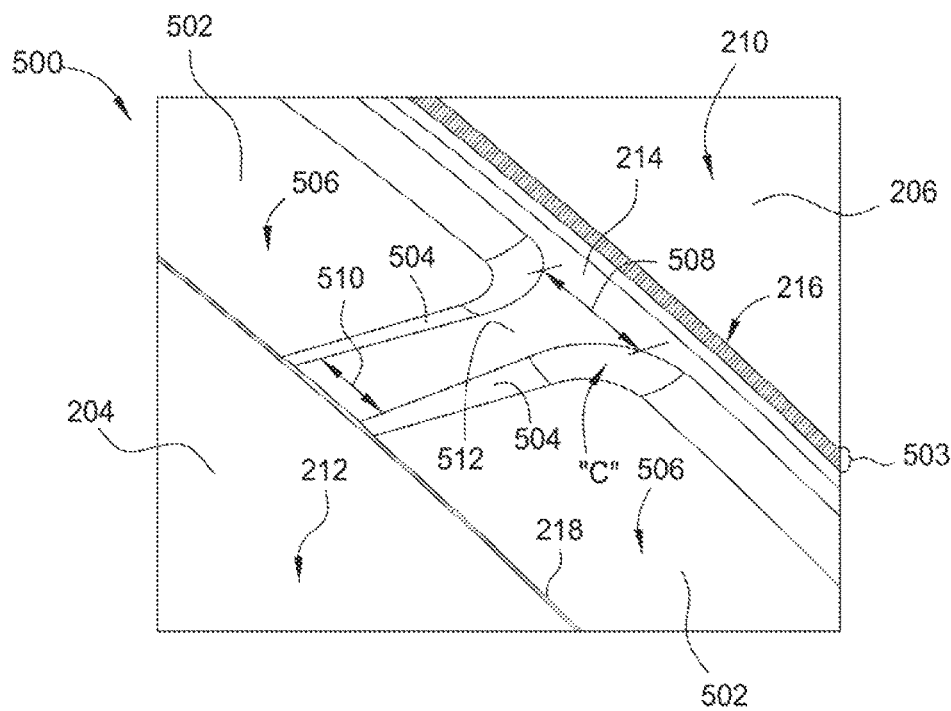
FIG. 5B illustrates an enlarged, partial top sectional view of the susceptor shown in FIG. 5A according to Implementations of the present disclosure.

FIG. 5A illustrates a perspective view of an exemplary susceptor 500 that may be used in place of the susceptor 106 (FIG. 1) according to Implementations of the present disclosure. The susceptor 500 has a plurality of cut-outs 502, for example about 2 to about 20 cut-outs. In one implementation as shown in FIG. 5A, six (6) wide cut-outs 502 are arranged within the second rim 208 around the circumference of the susceptor 500. FIG. 5B illustrates an enlarged, partial top sectional view of the susceptor 500 shown in FIG. 5A according to Implementations of the present disclosure.

As can be seen in FIG. 5B, a step 503 is formed at an interface between the second rim 208 and the first rim 206. The step 503 connects the top surface 210 of the first rim 206 to the angled surface 214. The step 503 may have a height of about 2 mm to about 3 mm to prevent a substrate (not shown) from slipping out during processing. The angled surface 214 couples the step 503 to the recessed portion 218 and provides a supporting surface for a substrate when the substrate is supported by the angled surface 214. The cut-outs 502 are formed to have a sidewall 504 encircling a bottom surface 506. The bottom surface 506 of the cut-out 502 is in parallel relationship to the top surface of the first rim 206. In some Implementations, the sidewalls 504 along the radial direction of the susceptor 500 are gradually decreased in thickness towards the recessed portion 218. In various Implementations, the sidewall 504 may gradually change in thickness of between about 0.55 mm and about 1.8 mm. Alternatively, each cut-out 502 may have a uniform thickness along the radial direction of the susceptor 500.

In one implementation as shown in FIG. 5B, each of the cut-outs 502 (only two cut-outs are partially seen) has two rounded corners "C" proximate to the step 503. In one implementation, the angled surface 214 sandwiched between two adjacent cut-outs 502 forms a T-shaped tab having a wide neck portion 508 at one end proximate to the first rim 206, a tip portion 510 at another end opposing the wide neck portion 508, and a narrow portion 512 connecting the wide neck portion 508 and the tip portion 510. In some Implementations, the number of the tabs may be between about 6 to about 360. The angled surface 214 or the T-shaped tab may have a thickness ranging between about 0.55 mm and about 1.8 mm. In some Implementations, the thickness of the T-shaped tab may be gradually changed along the radial direction from the first rim 206 towards the inner region 204. The tip portion 510 is proximate to the inner region 204 and extends in the same direction from the wide neck portion 508. The wide neck portion 508 is relatively wider than the tip portion 510. The tip portion 510 is relatively wider than the narrow portion 512. In one implementation, the narrow portion 512 of the angled surface 214 may be at a 2 degree downward slope towards the inner region 204 and forms a supporting surface for a substrate. In some Implementations, the wide neck portion 508 may be about 1.6 mm to about 2.2 mm in width, measuring from the corners of two adjacent cut-outs having the greatest thickness. The tip portion may be about 1.2 mm to about 1.6 mm in width, measuring from the sidewalls of two adjacent cut-outs having the smallest thickness. In one implementation, the sidewall at the corners "C" of the cut-out 502 is about 0.75 mm to about 1.5 mm in thickness. The wide neck portion 508 is about 1.99 mm in width, and the tip portion 510 is about 1.42 mm in width.

While the angled surface 214 forming a T-shaped tab is shown, any shape, such as arch-shaped, rectangular-shaped, square-shaped, round-shaped, V-shaped, U-shaped, or C-shaped taps and their variations, or elongated shape of the above, or a combination thereof is contemplated. The angled surface 214 may have a plurality of tabs having any of the shapes described herein, or the angled surface 214 may be in the form of a plurality of tabs having any of the shapes described herein.

Figure 6A:
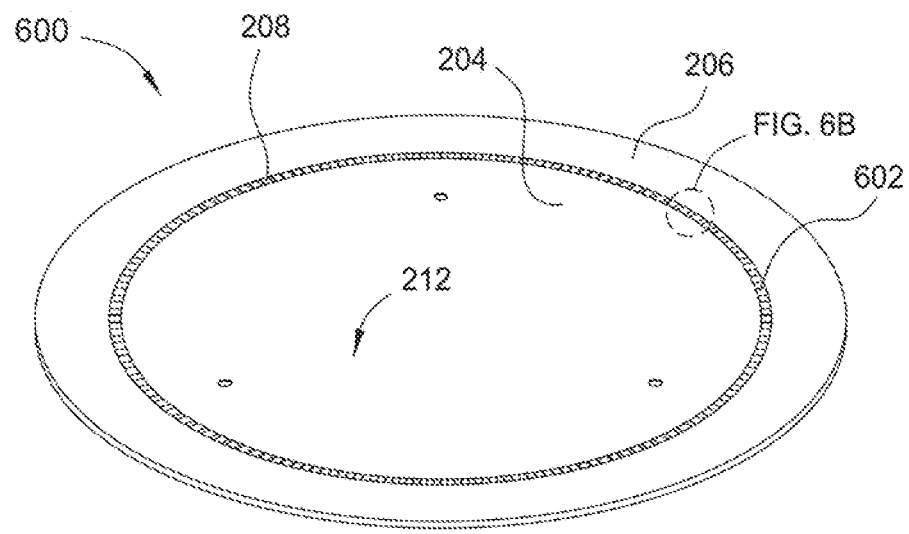
FIG. 6A illustrates a perspective view of a susceptor showing the cut-outs according to another implementation of the present disclosure.
Figure 6B:
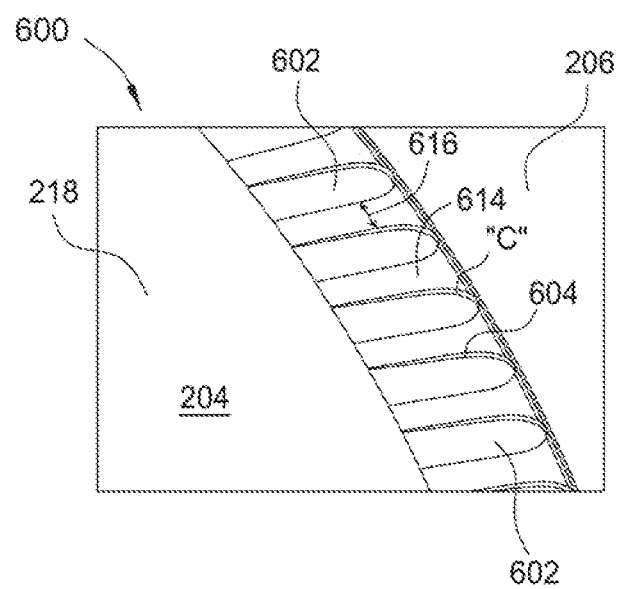
FIG. 6B illustrates an enlarged, partial top sectional view of the susceptor shown in FIG. 6A according to Implementations of the present disclosure.

FIG. 6A illustrates a perspective view of a susceptor 600 that may be used in place of the susceptor 106 (FIG. 1) according to another implementation of the present disclosure. The susceptor 600 has a plurality of cut-outs 602 formed in the second rim 208. In one aspect, there are 180 cut-outs 602 arranged within the second rim 208 around the circumference of the susceptor 600. FIG. 6B illustrates an enlarged, partial top sectional view of the susceptor 600 shown in FIG. 6A according to Implementations of the present disclosure. The cut-outs 602 formed in the angled surface 614 are elongated cut-outs extending along a radial direction of the susceptor 600. The cut-outs are separated from each other by a tap 620. Therefore, the taps 620 are formed in the angled surface 614 and may be spaced apart from one another at a regular interval around the circumference of the susceptor 600. The cut-outs 602 are spaced apart from one another azimuthally by an angle of about 2 degrees. More or less number of cut-outs is contemplated. In some Implementations where 12 cut-outs are adapted, the cut-outs may be spaced apart from one another azimuthally by an angle of about 30 degrees. In some Implementations where 24 cut-outs are adapted, the cut-outs may be spaced apart from one another azimuthally by an angle of about 15 degrees. It is also contemplated that the cut-outs and/or the taps may have any suitable shape such as arch, rectangular, square, round, V-shaped, or their variations.

In one implementation, the angled surface 614 may be at a 2 degree downward slope towards the inner region 204 and forms a supporting surface for a substrate. In some Implementations, the width of the space 616 between two adjacent cut-outs 602 is about 2 mm to about 4 mm, for example about 3 mm. Similar to Implementations of FIGS. 5A and 5B, the sidewalls 604 along the radial direction of the susceptor 106 are gradually decreased in thickness towards the recessed portion 218. In various Implementations, the sidewall 604 may gradually change in thickness of between about 0.55 mm and about 1.8 mm. In one implementation, the sidewall at the corners "C" of the cut-out 602 is about 0.75 mm to about 1.5 mm in thickness. Alternatively, each cut-out 602 may have a uniform thickness along the radial direction of the susceptor 600.

Figure 7A:
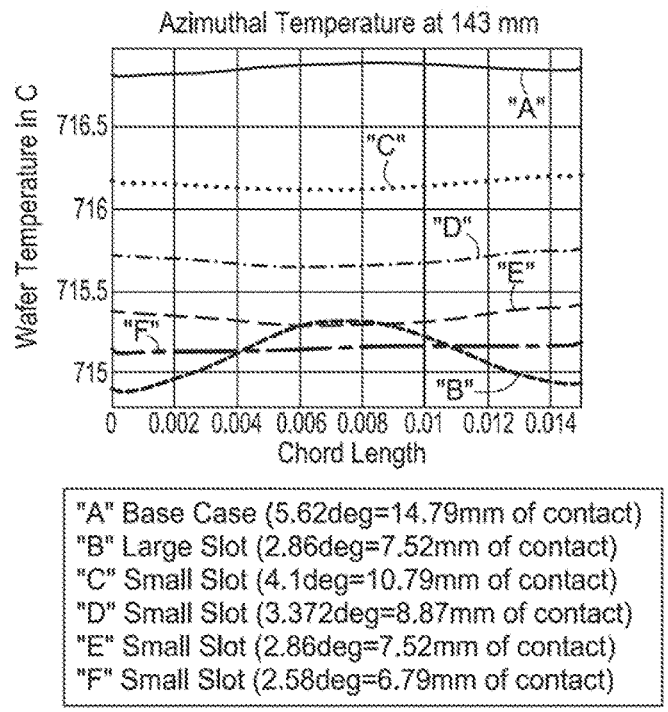
FIGS. 7A-7D are graphs illustrating substrate temperature as a function of chord length tested at different slopes of the angled surface according to Implementations of the present disclosure.
Figure 7B:
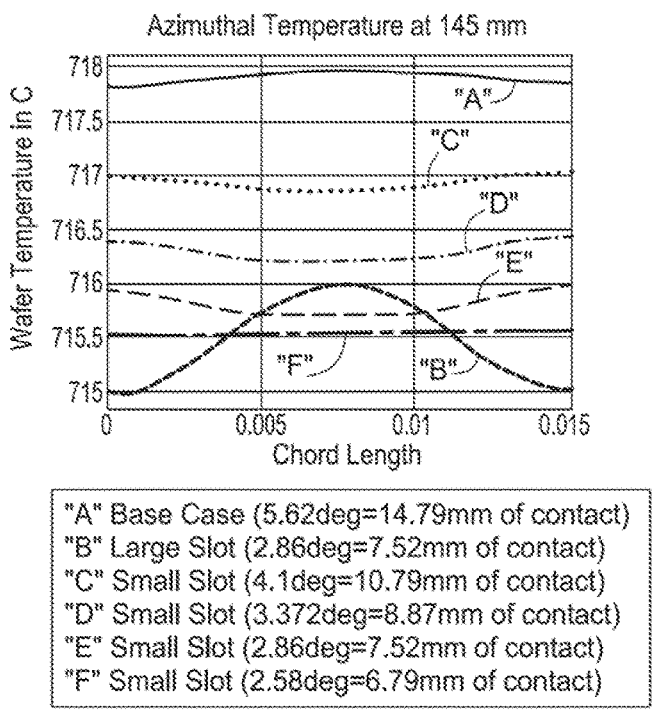
Figure 7C:
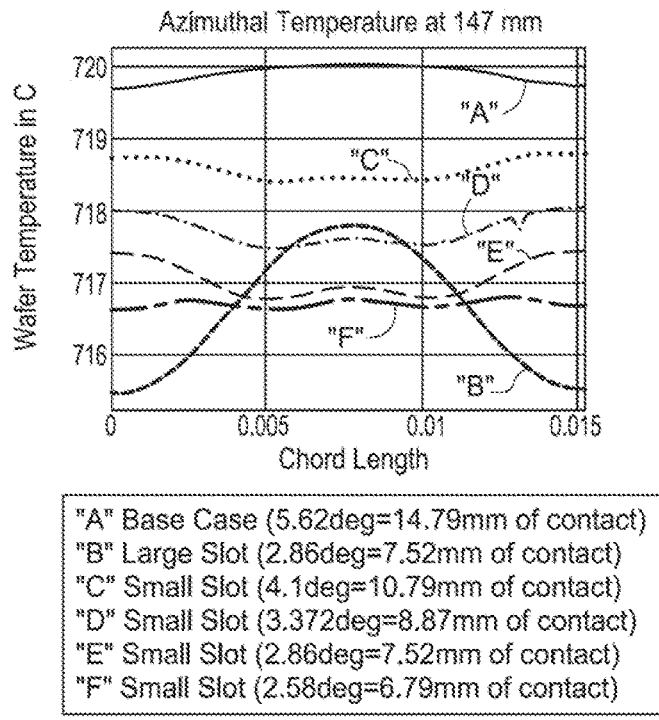
Figure 7D:
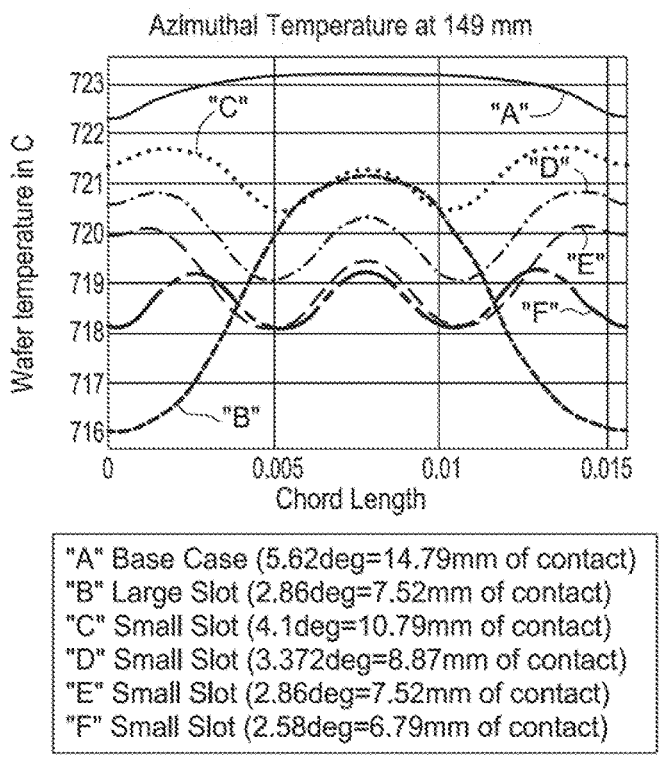

FIGS. 7A-7D are graphs illustrating substrate temperature (° C.) as a function of chord length (maximum distance across a substrate) tested at different slopes of the angled surface according to Implementations of the present disclosure. The graphs represent the azimuthal temperature profile at substrate edges. FIG. 7A shows azimuthal temperature profile measured at 143 mm from the center of the substrate. FIG. 7B shows azimuthal temperature profile measured at 145 mm from the center of the substrate. FIG. 7C shows azimuthal temperature profile measured at 147 mm from the center of the substrate. FIG. 7D shows azimuthal temperature profile measured at 149 mm from the center of the substrate. The curve line "F" in FIGS. 7A-7D are obtained using the Implementations associated with FIG. 4C of the present disclosure. As can be seen, the curve line "F" in every tests shows a much flatter azimuthal temperature profile compared to other curve lines obtained by adapting the angled surface with greater slope angles. It has been proved that Implementations of the present disclosure are able to provide a lower azimuthal non-uniformity even at 149 mm measuring from the center of the substrate.

Figure 8A:
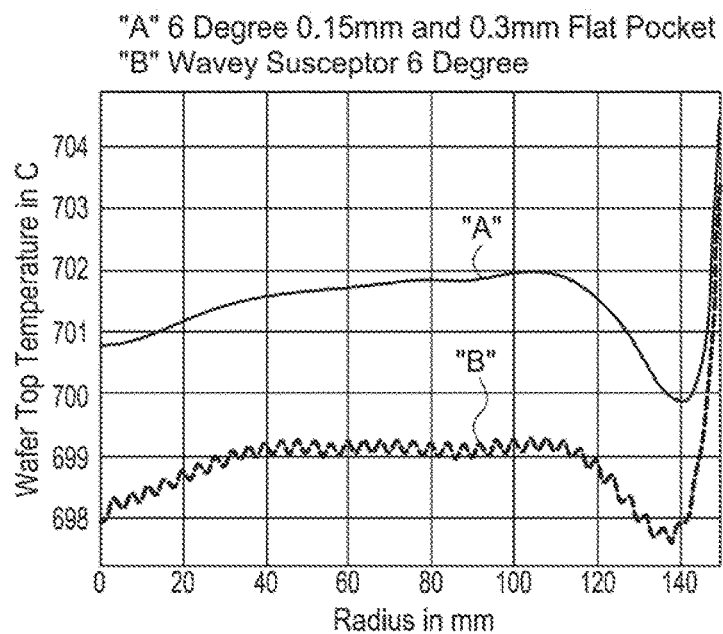
FIGS. 8A and 8B are graphs illustrating substrate temperature as a function of the radius of the substrate tested with two different susceptor designs according to Implementations of the present disclosure.
Figure 8B:
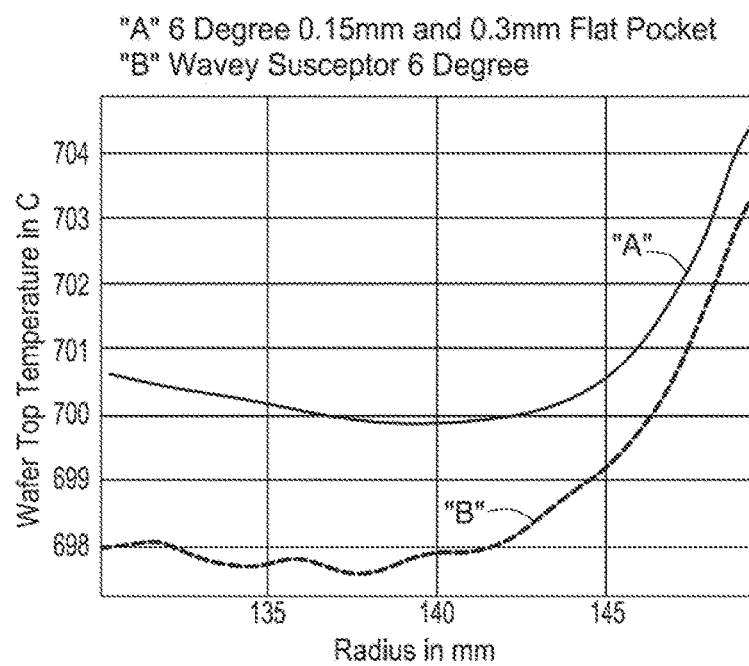

FIGS. 8A and 8B are graphs illustrating substrate temperature (° C.) as a function of the radius of the substrate (mm) tested with two different susceptor designs according to Implementations of the present disclosure. The curve line "A" represents the substrate temperature profile measured at a susceptor adapting a flat susceptor design as discussed above with respect to FIGS. 3A and 3B, which has a substrate support surface angled at a 6 degree downward slope towards an inner rim of the susceptor, with a 0.15 mm gap between a top surface of the inner rim and a back surface of the substrate, and a 0.3 mm gap between a top surface of a recessed portion and the back surface of the substrate. The curve line "B" represents the substrate temperature profile measured at a susceptor adapting a wavy susceptor design as discussed above with respect to FIG. 3C, which has a substrate support surface angled at a 6 degree downward slope towards an inner rim of the susceptor, with concentric annular ridges surrounding the center of the inner rim. As can be seen, there is a temperature profile valley around 140 mm from the center of the susceptor, and both curve lines "A" and "B" show the substrate temperature profile is relatively flatter.

Figure 9A:
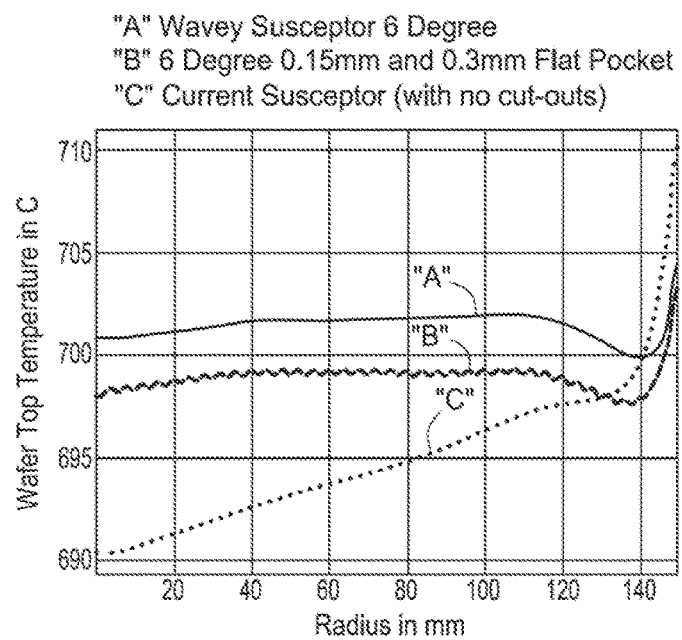
FIGS. 9A and 9B are graphs illustrating substrate temperature as a function of the radius of the substrate tested with three different susceptor designs according to Implementations of the present disclosure.
Figure 9B:
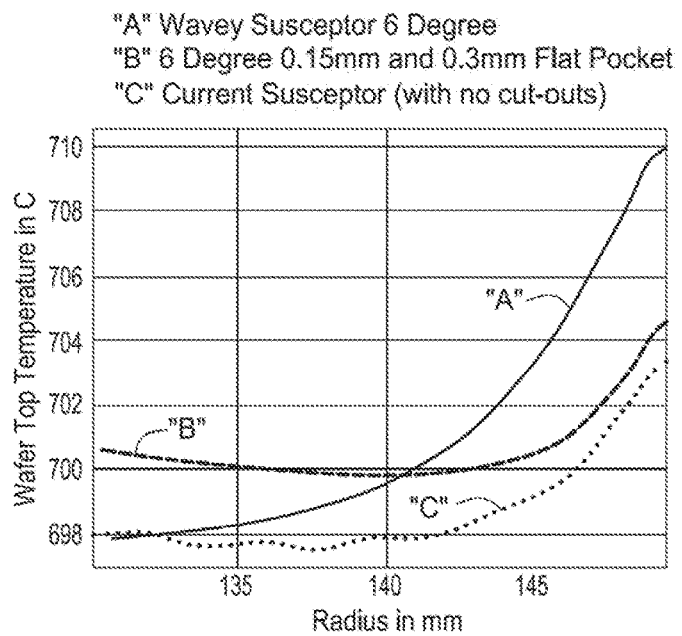

FIGS. 9A and 9B are graphs illustrating substrate temperature (° C.) as a function of the radius of the substrate (mm) tested with three different susceptor designs according to Implementations of the present disclosure. The curve line "A" represents the substrate temperature profile measured at a susceptor adapting a flat susceptor design as discussed above with respect to FIGS. 3A and 3B. The curve line "B" represents the substrate temperature profile measured at a susceptor adapting a wavy susceptor design as discussed above with respect to FIG. 3C. The curve line "C" represents the substrate temperature profile measured at a susceptor adapting a conventional susceptor design having no annular ridges, no recessed portion, and cut-outs. As can be seen, the curve lines "A" and "B" show the substrate temperature variation for the wavy and flat susceptor designs according to Implementations of the present disclosure is only about 5 degrees as compared to curve line "C".

The susceptor Implementations described herein allow for more uniform temperature control of substrates during thermal processes, such as epitaxy. The temperature control is improved by reducing the surface area of the substrate contacting the susceptor, which reduces edge thermal peak and the amount of conductive heat transferred from the susceptor and the substrate. Conductive heat transfer between the susceptor and the substrate is more difficult to control than radiant heat transfer, the primary source of heat transfer between the susceptor and the substrate. Reducing the surface area of the substrate contacting the susceptor allows for a higher percentage of the heat transfer to be radiant heat resulting in improved temperature control and improved depositions on the substrate. The Implementations disclosed reduce the conductive heat transfer near the edge of the substrate by providing cut-outs around the circumference of the susceptor, such as cut-outs in the angled surface of the susceptor to which the substrate is contact with, to reduce the contacting surface area between the susceptor and the substrate. The Implementations disclosed also help gas flow or exhaust gases by including venting channels at regular intervals within the inner rim of the susceptor around the circumference of the susceptor. The combination of the cut-outs and venting channels prevent the possibility of substantial amounts of conductive heat transfer near the center and edge of the substrate during processing.

Although the foregoing Implementations have been described using circular geometries (e.g., inner dish, first rim, annular ridge, etc.) to be used on semiconductor "wafers," the Implementations disclosed can be adapted to conform to different geometries.

While the foregoing is directed to Implementations of the present disclosure, other and further Implementations of the disclosure may be devised without departing from the basic scope thereof, and the scope thereof is determined by the claims that follow.

What is claimed is:

1. A susceptor, comprising:
a first rim surrounding and coupled to an inner region, the inner region having a top surface that is lower than a top surface of the first rim;
a second rim disposed between the inner region and the first rim, wherein the second rim comprises an angled support surface having a plurality of cut-outs formed therein, the angled support surface is inclined at a constant angle with respect to the top surface of the inner region and not parallel to the top surface of the first rim, and the plurality of cut-outs are extended along a radial direction of the susceptor;
a recessed portion disposed between the angled support surface and an outer edge of the inner region, wherein a top surface of the recessed portion is at an elevation lower than the top surface of the inner region; and
a plurality of venting channels formed in the top surface of the inner region, the venting channels extending radially from an outer edge of the inner region towards an inner edge of the inner region, wherein the cut-outs are in line with the venting channels.

2. The susceptor of claim 1, wherein the angled support surface extends radially inward from an inner edge of the first rim toward the inner region.

3. The susceptor of claim 2, wherein the angled support surface is inclined with respect to the top surface of the inner region at about 6 to about 15 degrees.

4. The susceptor of claim 1, further comprising:
one or more bumps extending from the top surface of the inner region.

5. The susceptor of claim 1, wherein the number of the cut-outs is from about 6 to about 360.

6. The susceptor of claim 1, wherein each cut-out is arch-shaped, rectangular-shaped, square-shaped, round-shaped, V-shaped, U-shaped, or C-shaped.

7. The susceptor of claim 6, wherein the cut-outs are alternating arch-shaped and rectangular-shaped cut-outs arranged around a circumference of the susceptor.

8. The susceptor of claim 1, wherein the venting channels and the cut-outs are arranged at regular intervals around a circumference of the susceptor.

9. The susceptor of claim 1, wherein the venting channels are spaced apart from one another azimuthally by an angle of about 4 degrees to about 8 degrees.

10. The susceptor of claim 8, wherein the venting channels have a bottom surface that is at a same elevation as a bottom surface of the cut-outs.

11. A susceptor, comprising:
a first rim surrounding and coupled to an inner region, the inner region having a top surface that is lower than a top surface of the first rim;
a second rim disposed between the inner region and the first rim, wherein the second rim comprises an angled support surface having a plurality of tabs formed therein, and the angled support surface is inclined at a constant angle with respect to the top surface of the inner region at about 6 degrees to about 15 degrees and not parallel to the surface of the first rim;
a recessed portion disposed between the angled support surface and an outer edge of the inner region, wherein a top surface of the recessed portion is at an elevation lower than the top surface of the inner region; and
a plurality of venting channels formed in the top surface of the inner region, the venting channels extending radially from an outer edge of the inner region towards an inner edge of the inner region, wherein the tabs are in line with the venting channels, and wherein the venting channels are spaced apart from one another azimuthally by an angle of about 4 degrees to about 8 degrees.

12. The susceptor of claim 11, wherein the number of the tabs is between about 6 to about 360.

13. The susceptor of claim 11, wherein the angled support surface has a thickness gradually changing along a radius of the susceptor.

14. The susceptor of claim 11, wherein the plurality of tabs are arch-shaped and extend along a radial direction of the susceptor.

15. A susceptor, comprising:
a first rim surrounding and coupled to an inner region, the inner region having a top surface that is lower than a top surface of the first rim;
a second rim disposed between the inner region and the first rim, the second rim comprising an angled substrate support surface having a plurality of tabs formed therein, wherein the angled substrate support surface is inclined at a constant angle of from 6 to 15 degrees with respect to the top surface of the inner region and not parallel to the top surface of the first rim, the plurality of tabs extend along a radial direction of the susceptor, and the tabs are spaced apart from one another azimuthally by an angle of about 2 degrees to about 15 degrees;
a recessed portion disposed between the angled substrate support surface and an outer edge of the inner region, wherein a top surface of the recessed portion is at an elevation lower than the top surface of the inner region; and
a plurality of venting channels formed in the top surface of the inner region, the venting channels extending radially from an outer edge of the inner region towards an inner edge of the inner region, wherein the tabs are in line with the venting channels, and wherein the venting channels are spaced apart from one another azimuthally by an angle of about 4 degrees to about 8 degrees.

* * * * *

UNITED STATES PATENT AND TRADEMARK OFFICE
CERTIFICATE OF CORRECTION

PATENT NO. : 10,269,614 B2
APPLICATION NO. : 14/885016
DATED : April 23, 2019
INVENTOR(S) : Schubert S. Chu et al.

Page 1 of 1

It is certified that error appears in the above-identified patent and that said Letters Patent is hereby corrected as shown below:

In the Specification

In Column 10, Line 56, delete "taps" and insert -- tabs --, therefor.

In Column 11, Line 7, delete "tap 620" and insert -- tab --, therefor.

In Column 11, Line 7, delete "taps 620" and insert -- tabs --, therefor.

In Column 11, Line 19, delete "taps" and insert -- tabs --, therefor.

Signed and Sealed this
Sixteenth Day of July, 2019

Andrei Iancu
*Director of the United States Patent and Trademark Office*